United States Patent
Cheng et al.

(10) Patent No.: US 12,100,926 B2
(45) Date of Patent: Sep. 24, 2024

(54) PHOTODETECTOR CHIP, OPTICAL RECEIVING AND TRANSCEIVER COMPONENTS, OPTICAL MODULE, AND COMMUNICATIONS DEVICE

(71) Applicant: HUAWEI TECHNOLOGIES CO., LTD., Guangdong (CN)

(72) Inventors: Yuanbing Cheng, Wuhan (CN); Heng Wang, Dongguan (CN); Jing Dai, Shenzhen (CN); Yinghua Dong, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 819 days.

(21) Appl. No.: 17/243,656

(22) Filed: Apr. 29, 2021

(65) Prior Publication Data

US 2021/0249835 A1 Aug. 12, 2021

Related U.S. Application Data

(63) Continuation of application No. PCT/CN2018/112927, filed on Oct. 31, 2018.

(51) Int. Cl.
*H01S 3/10* (2006.01)
*G02B 6/12* (2006.01)
(Continued)

(52) U.S. Cl.
CPC ...... *H01S 3/10023* (2013.01); *G02B 6/12009* (2013.01); *H01S 5/141* (2013.01); *H04B 10/691* (2013.01)

(58) Field of Classification Search
CPC .... H01S 3/10023; H01S 5/141; H01S 5/5045; H01S 5/026; H01S 5/0264; H04B 10/691;
(Continued)

(56) References Cited

U.S. PATENT DOCUMENTS 5,239,410 A 8/1993 Nishimura et al.
6,410,941 B1 6/2002 Taylor et al.
(Continued)

FOREIGN PATENT DOCUMENTS

CN 101222121 A 7/2008
CN 101473439 A 7/2009
(Continued)

OTHER PUBLICATIONS

Office Action issued in JP2021-547615 with English Translation, dated Jun. 28, 2022, 10 pages.
(Continued)

*Primary Examiner* — Eric L Bolda

(57) ABSTRACT

An embodiment of the present invention provides a photodetector chip, including a substrate, a semiconductor optical amplification section, and a photodetection section. The substrate includes a surface, the photodetection section and the semiconductor optical amplification section are arranged on the substrate, and the photodetection section is located in an optical signal output direction of the semiconductor optical amplification section. The semiconductor optical amplification section amplifies and filters an input optical signal to output an amplified and filtered optical signal to the photodetection section. The photodetection section is configured to convert the amplified and filtered optical signal into an electrical signal. The semiconductor optical amplification section includes a grating, the grating includes a first grating and a second grating that are cascaded, and the first grating is a slanted grating. The first grating and the second grating are configured to filter an optical signal entering the semiconductor optical amplification section.

20 Claims, 4 Drawing Sheets

(51) Int. Cl.
*H01S 5/14* (2006.01)
*H04B 10/69* (2013.01)

(58) Field of Classification Search
CPC ............ G02B 6/12007; G02B 6/12009; G02B 6/12019
See application file for complete search history.

(56) References Cited

U.S. PATENT DOCUMENTS

| | | | |
|---|---|---|---|
| 8,611,756 | B1 | 12/2013 | Wach |
| 10,042,131 | B1 | 8/2018 | Lesea |
| 2003/0015707 | A1 | 1/2003 | Bosco et al. |
| 2004/0033004 | A1* | 2/2004 | Welch ................ H01S 5/04254 385/14 |
| 2004/0119079 | A1 | 6/2004 | Hayakawa et al. |
| 2004/0213582 | A1 | 10/2004 | Joyner |
| 2005/0249509 | A1* | 11/2005 | Nagarajan ................ H01S 5/12 398/198 |
| 2011/0135314 | A1* | 6/2011 | Tolstikhin ............ H01S 5/0262 398/149 |
| 2015/0303653 | A1 | 10/2015 | Tanaka |

FOREIGN PATENT DOCUMENTS

| | | | |
|---|---|---|---|
| CN | 102369676 | A | 3/2012 |
| CN | 102841479 | A | 12/2012 |
| CN | 102882601 | A | 1/2013 |
| CN | 103248447 | A | 8/2013 |
| CN | 105356295 | A | 2/2016 |
| CN | 106158998 | A | 11/2016 |
| CN | 107566045 | A | 1/2018 |
| CN | 107658321 | A | 2/2018 |
| CN | 108089262 | A | 5/2018 |
| CN | 108447938 | A | 8/2018 |
| EP | 0386797 | A2 | 9/1990 |
| JP | S61114588 | A | 6/1986 |
| JP | H01170084 | A | 7/1989 |
| JP | H02194687 | A | 8/1990 |
| JP | 02226233 | A * | 9/1990 |
| JP | H03161967 | A | 7/1991 |
| JP | H04229684 | A | 8/1992 |
| JP | H07226530 | A | 8/1995 |
| JP | 2684568 | B2 | 12/1997 |
| JP | 2000138362 | A | 5/2000 |
| JP | 2004317783 | A | 11/2004 |
| JP | 2004347944 | A | 12/2004 |
| JP | 2006029995 | A | 2/2006 |
| WO | 03102659 | A2 | 12/2003 |
| WO | 2017152401 | A1 | 9/2017 |

OTHER PUBLICATIONS

Notice of Allowance issued in CN201880098703.9, dated Jul. 15, 2022, 5 pages.
Chinese Office Action for Application No. 201880098703.9 dated Apr. 8, 2022, 6 pages.
International Search Report and Written Opinion issued in PCT/CN2018/112927, dated Feb. 12, 2019, 9 pages.
Office Action issued in CN201880098703.9, dated Oct. 26, 2021, 9 pages.
Office Action issued in KR10-2021-7014832 with English translation, dated Jul. 19, 2022, 9 pages.

* cited by examiner

PHOTODETECTOR CHIP, OPTICAL RECEIVING AND TRANSCEIVER COMPONENTS, OPTICAL MODULE, AND COMMUNICATIONS DEVICE

CROSS-REFERENCE TO RELATED APPLICATIONS

This application is a continuation of International Application No. PCT/CN2018/112927, filed on Oct. 31, 2018, the disclosure of which is hereby incorporated by reference in its entirety.

TECHNICAL FIELD

The present invention relates to the field of optical communications technologies, and in particular, to a photodetector chip, an optical receiving component, an optical transceiver, an optical module, and a communications device.

BACKGROUND

Increasing data demands impose higher requirements on capacity and bandwidth of a transport network. Interconnection between high-speed communications devices has become a basis for building a high-speed and large-capacity transport network. A high-speed optical receiving device is an important part of a data transport network, and is mainly used to implement optical receiving and optical-to-electrical conversion of an optical module, where the photodetector chip is an important component of the optical receiving device. In the prior art, the high-speed and large-capacity transport network is implemented mainly by improving a single-channel modulation rate. However, the optical receiving device is limited by high excess noise caused by large modulation bandwidth, making it difficult to meet a demand for high sensitivity.

SUMMARY

An embodiment of this application provides a photodetector chip, which can reduce ASE noise caused by an amplifier while obtaining a relatively high gain effect, thereby improving sensitivity of an optical receiving component.

An embodiment of this application further provides an optical receiving component, an optical transceiver, an optical module, and a communications device.

According to a first non-limiting aspect of an example embodiment, a monolithic integrated optical receiving chip is provided, including: a substrate, a semiconductor optical amplification section, and a photodetection section. The substrate includes a surface, the photodetection section and the semiconductor optical amplification section are horizontally integrated on the surface of the substrate, and the photodetection section is located in an optical signal output direction of the semiconductor optical amplification section.

The semiconductor optical amplification section amplifies and filters an input optical signal to output an amplified and filtered optical signal to the photodetection section.

The photodetection section is configured to convert the amplified and filtered optical signal into an electrical signal.

The semiconductor optical amplification section includes a grating, the grating includes a first grating and a second grating, the first grating and the second grating are sequentially cascaded along the optical signal output direction, and the first grating is a slanted grating.

The first grating and the second grating are configured to filter an optical signal entering the semiconductor optical amplification section, so that light of a specific wavelength passes and light of another wavelength is filtered out.

In the photodetector chip in the present disclosure, a high preamplification gain is achieved through monolithic integration of the semiconductor optical amplification section and the photodetection section, and two cascaded gratings, namely, the first grating and the second grating are arranged in the semiconductor optical amplification section to function as a band-pass filter, so as to filter an optical signal passing through the semiconductor optical amplification section, thereby reducing amplified spontaneous radiation, namely, ASE noise caused by a high gain of the semiconductor optical amplification section while ensuring the high gain, and improving sensitivity of the photodetector chip.

A period of the first grating is different from a period of the second grating. A bandpass wavelength width for grating filtering is adjusted by controlling the grating periods of the first grating and the second grating. In addition, a band gap of a bandpass filter and contrast of filtering can be increased by improving grating coupling strength.

In an embodiment, the first grating is arranged, in a direction perpendicular to the surface of the substrate, oblique relative to the optical signal output direction. In this embodiment, the first grating is used as an example. A shading line of the first grating is bar-shaped, has a rectangular cross section, and includes two opposite side surfaces and two mutually parallel surfaces connecting the two side surfaces. The two side surfaces are parallel to each other and are oblique relative to the optical signal output direction. In this embodiment, the optical signal output direction can be considered as a waveguide direction of the semiconductor optical amplification section. A transmitting area is increased to implement that waves of a specific frequency band pass and waves of another frequency band are shielded. This can be interpreted as follows: A cross section of the first grating along the waveguide direction is parallelograms periodically arranged, and a grating period includes a parallelogram comprising a high refractive index material and a connected parallelogram comprising a low refractive index material. In addition, sides of the two parallelograms are parallel, and the two pairs of sides are parallel to each other and are oblique relative to the waveguide direction of the semiconductor optical amplification section.

In another embodiment, the first grating is arranged, on a plane parallel to the surface of the substrate, oblique relative to the optical signal output direction of the semiconductor optical amplification section.

In an embodiment, the second grating is a slanted grating or a non-slanted grating. The second grating is arranged, in a direction perpendicular to or parallel to the surface of the substrate, oblique relative to the optical signal output direction with an inclination angle of 2 degrees to 10 degrees.

This can be interpreted as follows: The first grating is arranged, oblique relative to the waveguide direction of the semiconductor optical amplification section, on a plane parallel to an active layer of the semiconductor optical amplification section and in the direction perpendicular to the surface of the substrate. The second grating is arranged, oblique relative to the waveguide direction of the semiconductor optical amplification section, on the plane parallel to the active layer of the semiconductor optical amplification section and in the direction perpendicular to the surface of the substrate.

An inclination angle of the first grating is 2 degrees to 10 degrees. Reflected light of the grating cannot be coupled into a guide of the semiconductor optical amplification section, so that the light of the specific wavelength passes and light of another wavelength is filtered out.

Further, a spacing between the first grating and the second grating is an integer multiple of a length of the first grating and an integer multiple of a length of the second grating. The first grating and the second grating are sequentially cascaded along the waveguide direction.

The first grating and the second grating are located above or below an active layer of the semiconductor optical amplification section in the direction perpendicular to the surface of the substrate; and a vertical distance between the first and second gratings and the active layer of the semiconductor optical amplification section is less than 1000 nanometers.

The first grating and the second grating are 10-nanometer to 500-nanometer thick and comprise one of materials InGaAsP, Si, GeSi, or InGaN.

The semiconductor optical amplification section is directly connected to the photodetection section (this can be interpreted as follows: the semiconductor optical amplification section includes a first coupling end, the photodetector includes a second coupling end, and the first coupling end is directly connected to the second coupling end), so that an optical signal amplified by the semiconductor optical amplification section is directly coupled into the photodetection section, to ensure that the optical signal amplified by the semiconductor optical amplification section is directly coupled into the photodetection section to improve coupling efficiency.

A waveguide width of the semiconductor optical amplification section gradually decreases from the coupling end on a light input side to a direction of the photodetection section, and a waveguide width of the photodetection section gradually increases toward a coupling direction of the light input side of the semiconductor optical amplification section, to ensure efficiency of optical coupling between the semiconductor optical amplification section and the photodetection section.

The photodetector chip includes a passive waveguide, and the optical signal amplified by the semiconductor optical amplification section is coupled into a waveguide of the photodetection section through the passive waveguide. A waveguide width of the passive waveguide layer gradually increases along an optical transmission direction, so that power of light entering the passive waveguide gradually increases. Specifically, the passive waveguide layer is arranged between the semiconductor optical amplification section and the photodetection section, and the first and second coupling surfaces of the passive optical waveguide are respectively connected and aligned with the semiconductor optical amplification section and the photodetection section. A waveguide size of the first coupling surface matches a waveguide cross-sectional size of the semiconductor optical amplification section to reduce mode mismatch, and a waveguide size of the second coupling surface matches a waveguide size of the photodetection section to reduce mode mismatch, so as to improve coupling efficiency of the semiconductor optical amplification section and the photodetection section.

A band gap wavelength of the passive waveguide is less than a band gap wavelength of the active layer of the semiconductor optical amplification section, and a difference is at least 150 nm, to ensure that optical transmission loss is low enough.

The photodetector chip includes a diluted waveguide layer that is in the direction perpendicular to the surface of the substrate. The diluted waveguide layer is located below the active layer of the semiconductor optical amplification section and an active layer of the photodetection section and located above the substrate; and a main function of the diluted waveguide layer is: enlarging a fundamental transverse mode spot of the semiconductor optical amplification section and reducing mode mismatch between a single-mode optical fiber and the semiconductor optical amplification section, thereby increasing optical coupling efficiency. In addition, the diluted waveguide can also be configured to couple the optical signal amplified by the semiconductor optical amplification section into the photodetection section through the diluted waveguide layer. The diluted waveguide layer includes two or more materials with alternating refractive indexes. Specifically, when the photodetector chip includes the passive waveguide layer or the diluted waveguide layer, the passive waveguide layer or the diluted waveguide layer is formed on the substrate and below the active layer of the semiconductor optical amplification section and the active layer of the photodetection section. Further, along the optical transmission direction, the waveguide width of the semiconductor optical amplification section gradually decreases, and the waveguide width of the photodetection section gradually increases, to implement coupling matching of the semiconductor optical amplification section and the photodetection section.

The photodetector chip includes a first electrode layer, a second electrode layer, a third electrode layer, and an isolation groove that is in the direction perpendicular to the surface of the substrate; the first electrode layer is located on the top of the semiconductor optical amplification section, the second electrode layer is located on the top of the photodetection section, and the third electrode layer is located on an outer surface that is away from the semiconductor optical amplification section and that is of the substrate; and the isolation groove is located between the first electrode and the second electrode layer to isolate the first electrode layer from the second electrode layer. The isolation groove is configured to insulate the first electrode and the second electrode, so as to reduce electrical crosstalk of the photodetector chip.

In the optical transmission direction, a length of the semiconductor optical amplification section is 50 microns to 800 microns, a length of the isolation groove is 20 microns, and a length of the photodetection section is 5 microns to 100 microns.

The semiconductor optical amplification section includes a first confinement layer, the active layer, and a second confinement layer that are sequentially stacked; the photodetection section includes a third confinement layer, the active layer of the photodetection section, and a fourth confinement layer; and the active layer of the semiconductor optical amplification section is coupled to the active layer of the photodetection section.

According to a second non-limiting aspect of an example embodiment, this application provides an optical receiving component, including a receiving base and the photodetector chip, where the photodetector chip is packaged on the receiving base.

According to a third non-limiting aspect of an example embodiment, this application provides an optical transceiver component, including a base, an optical transmitter, and the optical receiving component, and the optical transmitter and the optical receiving component are packaged on the base.

According to a fourth non-limiting aspect of an example embodiment, this application provides an optical module, including a circuit board, and the optical transceiver component arranged on the circuit board.

According to a fifth non-limiting aspect of an example embodiment, this application provides a communications device, including a mainboard and the optical module inserted into the main board, and the communications device is an optical line terminal OLT or an optical network unit ONU.

In the photodetector chip in this application, two cascaded gratings, namely, the first grating and the second grating are arranged in the semiconductor optical amplification section to function as a band-pass filter, so as to filter an optical signal passing through the semiconductor optical amplification section, thereby reducing amplified spontaneous radiation, namely, ASE noise caused by a high gain of the semiconductor optical amplification section while ensuring the high gain, and improving sensitivity of the photodetector chip.

DESCRIPTION OF EMBODIMENTS

The following describes the technical solutions in the embodiments of the present invention with reference to the accompanying drawings in the embodiments of the present invention.

Figure 1:
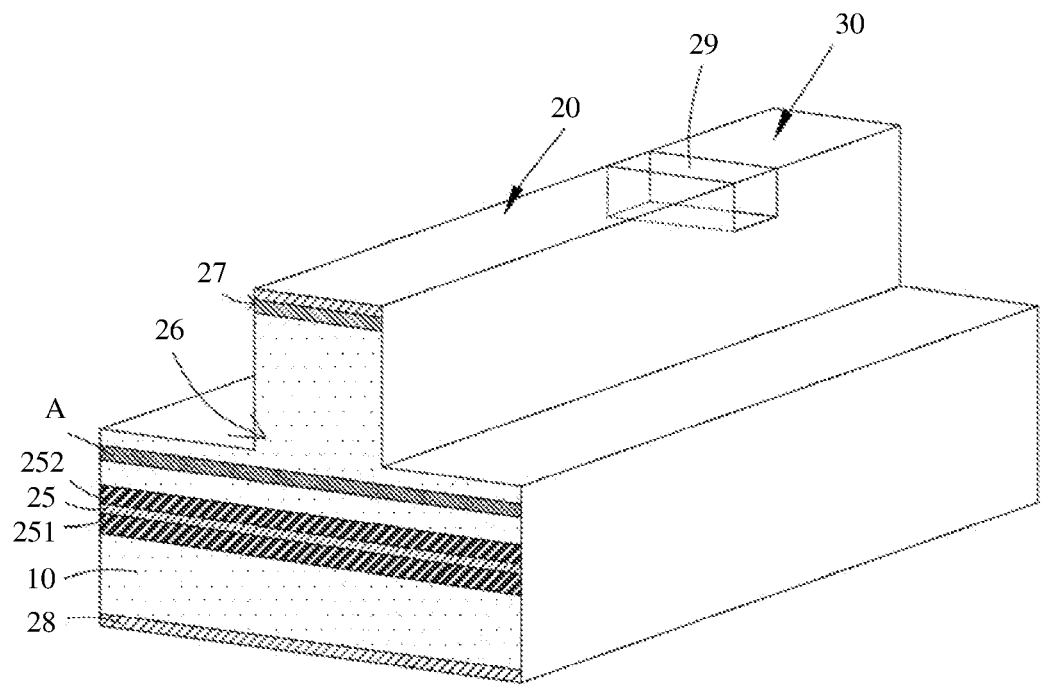
FIG. 1 is a schematic structural diagram of a photodetector chip according to an embodiment of this application, where a cross-sectional view of a semiconductor optical amplification section is shown, and the cross section is perpendicular to a waveguide direction.
Figure 2:
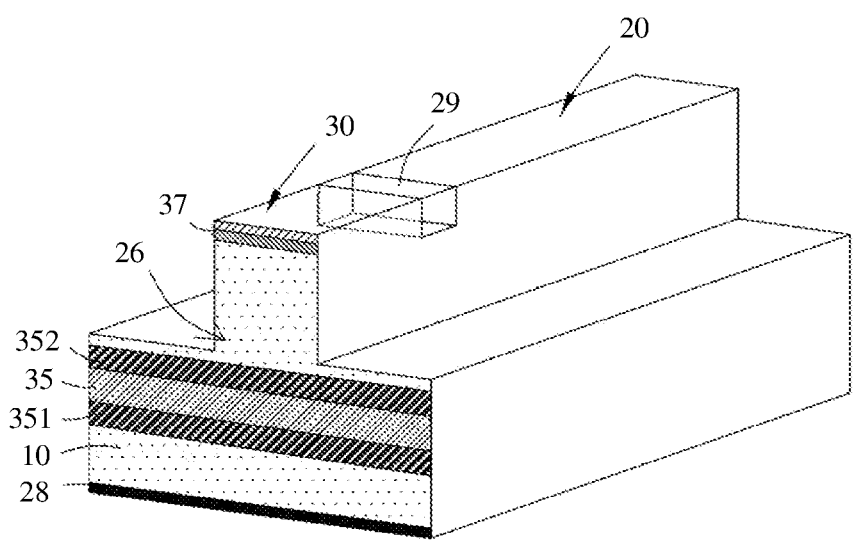
FIG. 2 is a partial cross-sectional view, showing a photodetection section, of the photodetector chip shown in FIG. 1, where the cross section is perpendicular to the waveguide direction.

As shown in FIG. 1 and FIG. 2, an embodiment of this application provides a photodetector chip, configured to perform optical-to-electrical signal conversion on light in an optical receiving component. The photodetector chip includes a substrate 10, a semiconductor optical amplification section 20, and a photodetection section 30. The substrate 10 includes a surface 11, the photodetection section 30 and the semiconductor optical amplification section 20 are arranged on the surface of the substrate 10, and the photodetection section 30 is located in an optical signal output direction of the semiconductor optical amplification section 20. Integration of the photodetection section 30 and the semiconductor optical amplification section 20 achieves miniaturized monolithic integration performance.

The semiconductor optical amplification section 20 amplifies and filters an input optical signal to output an amplified and filtered optical signal to the photodetection section 30. The photodetection section 30 is configured to convert the amplified and filtered optical signal into an electrical signal.

Figure 3:
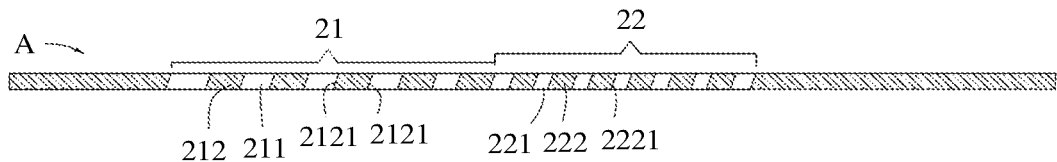
FIG. 3 is a schematic cross-sectional view, along a waveguide direction, of a first embodiment of a grating of the photodetector chip shown in FIG. 1.
Figure 4:
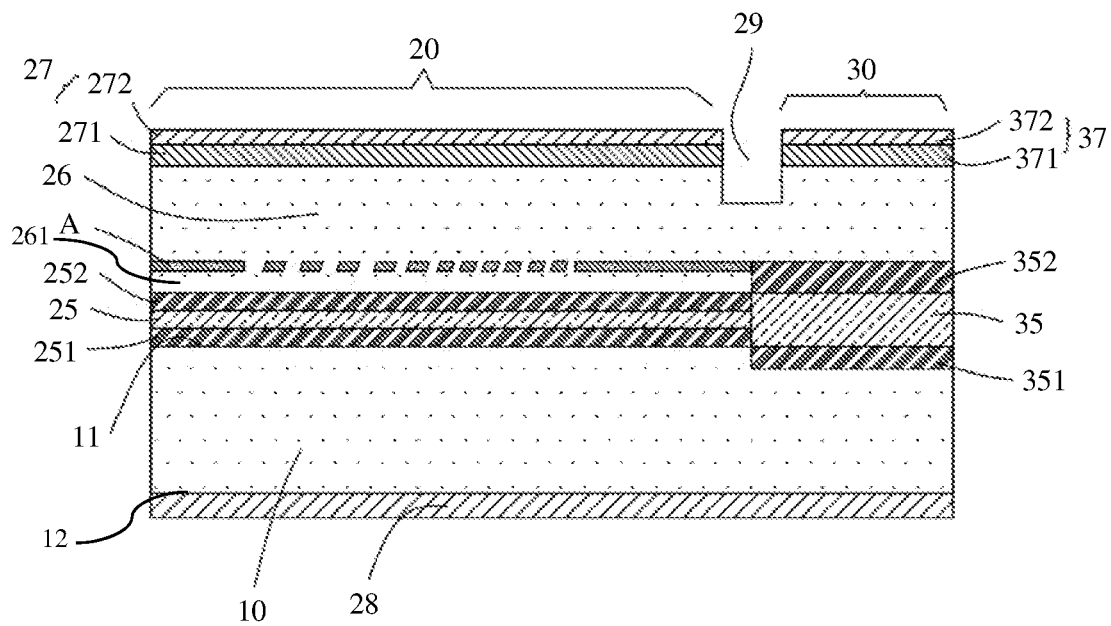
FIG. 4 is a schematic cross-sectional view, along a waveguide direction at another angle, of the photodetector chip shown in FIG. 1 including the grating shown in FIG. 3.

As shown in FIG. 3 and FIG. 4, the semiconductor optical amplification section 20 includes a grating A, and the grating includes a first grating 21 and a second grating 22. Along the optical signal output direction of the semiconductor optical amplification section 20 (light enters the semiconductor optical amplification section 20 from a coupling surface on a light-incident side of the semiconductor optical amplification section 20, exits from another end surface opposite to the coupling surface, and enters the photodetection section 30), the first grating 21 and the second grating 22 are sequentially cascaded, and the first grating 21 is a slanted grating. The first grating 21 and the second grating 22 are configured to filter an optical signal entering the semiconductor optical amplification section 20, so that light of a specific wavelength passes and light of another wavelength is filtered out.

In the photodetector chip, a high preamplification gain is achieved through horizontal integration, instead of vertically stacked integration, of the semiconductor optical amplification section 20 and the photodetection section 30, and two cascaded gratings, namely, the first grating 21 and the second grating 22 are arranged in the semiconductor optical amplification section 20 to function as a band-pass filter, which meets a requirement for a wide incident wavelength bandwidth, so as to filter an optical signal passing through the semiconductor optical amplification section 20, thereby reducing amplified spontaneous radiation, namely, ASE noise caused by a high gain of the semiconductor optical amplification section 20 while ensuring the high gain and the wide incident wavelength bandwidth, and improving sensitivity of the photodetector chip.

Further, as shown in FIG. 3, a period of the first grating 21 is different from a period of the second grating 22. A bandpass wavelength width for grating filtering is adjusted by controlling the grating periods of the first grating 21 and the second grating 22, to meet a requirement for passing a wide incident wavelength bandwidth. A band gap of a bandpass filter and contrast of filtering can be increased by improving a grating coupling factor.

Specifically, as shown in FIG. 4, in this embodiment, the substrate 10 comprises an indium phosphide material. The semiconductor optical amplification section 20 includes a first confinement layer 251, the active layer 25, and a second confinement layer 252 that are sequentially stacked. The photodetection section 30 includes a third confinement layer 351, an active layer 35, and a fourth confinement layer 352 that are sequentially stacked. The active layer 25 of the semiconductor optical amplification section 20 and the active layer 35 of the photodetection section are sequentially arranged and coupled in an optical transmission direction, which is horizontal integration. The semiconductor optical amplification section 20 and the photodetection section 30 are formed on the substrate 10 by means of growth. To be specific, in a manner, the semiconductor optical amplification section 20 and the photodetection section 30 are directly connected, so that an optical signal amplified by the semiconductor optical amplification section 20 is directly coupled into the photodetection section 30. The photodetector chip further includes a waveguide cover layer 26, the waveguide cover layer 26 covers the second confinement layer 252 and the fourth confinement layer 352, and the first confinement layer 251 and the third confinement layer 351 are formed on the surface 11 of the substrate 10. In this embodiment, the waveguide cover layer 26 is configured to form, together with an electrode layer of the chip, a waveguide for optical transmission, and comprises an InP material with a thickness of 1.5 μm to 2 μm and a doping concentration greater than 1E18 $cm^{-3}$.

A spacing layer 261 is arranged between the grating A and the second confinement layer 252 of the semiconductor optical amplification section 20. Specifically, the grating A is located on one side, away from the active layer 25, of the second confinement layer 252 on the active layer 25, and is spaced apart from the second confinement layer 252 by the spacing layer 261. The grating A is a uniform grating. Further, the first grating 21 and the second grating 22 are 10-nanometer to 500-nanometer thick and comprise one of materials InGaAsP, Si, GeSi, or InGaN.

The first grating 21 includes a plurality of slits 211 and a shading line 212 spaced between every two slits 211, and the plurality of slits 211 of the first grating 21 have a same width. The second grating 22 includes a plurality of slits 221 and a shading line 222 spaced between every two slits, and the plurality of slits 222 of the second grating 22 have a same width. In this embodiment, the slit 212 of the first grating 21 is larger than the slit 222 of the second grating 22, that is, a grating constant of the first grating 21 is larger than that of the second grating 22. The grating can be a full grating form or a partial grating form. The full grating form means that there are shading lines and slits all over a grating length, for example, a plurality of first gratings 21 and a plurality of second gratings 22 are formed. The partial grating form means that there are shading lines and slits in a part of the grating length. For example, only the first grating 21 and the second grating 22 are included, the grating length is L, a sum of lengths of the first grating 21 and the second grating 22 is L1, and an L-L1 area has no grating slits and shading lines. The slit 211 means a part with a high refractive index material, and the shading line 212 means a part with a low refractive index material.

In this embodiment, in a direction perpendicular to the surface 11 of the substrate 10, the grating A is stacked above or below the active layer 25 of the semiconductor optical amplification section 20. Specifically, the grating A is stacked on one side, facing the substrate 10 or away from the substrate 10, of the active layer 25 of the semiconductor optical amplification section 20 and is spaced apart from the active layer 25 of the semiconductor optical amplification section 20 and specifically, spaced apart by a spacing layer 261. In this embodiment, the first grating 21 and the second grating 22 of the grating are located on the side, away from the surface 11, of the substrate 10 of the active layer 25 of the semiconductor optical amplification section 20 and are spaced apart from the second confinement layer 252.

The spacing layer is located between the first separate confinement layer 251 and the substrate 10 or between the confinement layer 252 of the semiconductor optical amplification section 20 and the waveguide cover layer 26, and the second separate confinement layer 252 is spaced apart from the grating layer A by the spacing layer 261. The waveguide cover layer 26 of the semiconductor optical amplification section 20 covers the grating A.

Further, a vertical distance between the first and second gratings 21 and 22 and the active layer 25 of the semiconductor optical amplification section 20 is less than 1000 nanometers.

As shown in FIG. 3 and FIG. 4, in a first embodiment of this application, the first grating 21 and the second grating 22 are arranged, in a direction perpendicular to the surface 11 of the substrate 10, oblique relative to the optical signal output direction of the semiconductor optical amplification section 20. In this embodiment, that the first grating 21 and the second grating 22 are both oblique is used as an example. Cross sections of the first grating 21 and the second grating 22 along the waveguide direction are parallelograms, and each of them includes two opposite side surfaces 2121 and mutually parallel surfaces connecting the two side surfaces 2121. Specifically, the two side surfaces 2121 of the first grating 21 and the two side surfaces 2221 of the second grating 22 are parallel to each other and are oblique relative to a waveguide direction (the optical signal output direction) of the semiconductor optical amplification section 20, that is, the gratings are slanted gratings. In addition, length directions of the first grating 21 and the second grating 22 are not oblique. When the first grating 21 and the second grating 22 are both obliquely arranged, angles of inclination of the first grating 21 and the second grating 22 may be the same or different. In other embodiments, the first grating 21 is a slanted grating, and the second grating 22 is not oblique.

Figure 5:
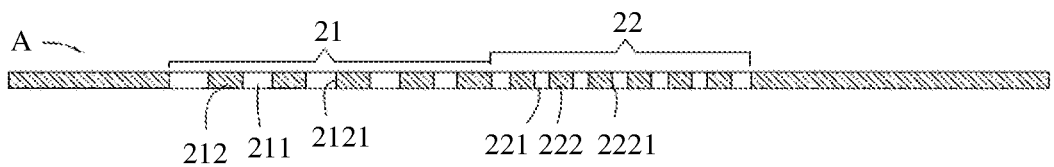
FIG. 5 and FIG. 6 are schematic cross-sectional views, along a waveguide direction at two different angles, of a second embodiment of a grating of the photodetector chip shown in FIG. 1
Figure 6:
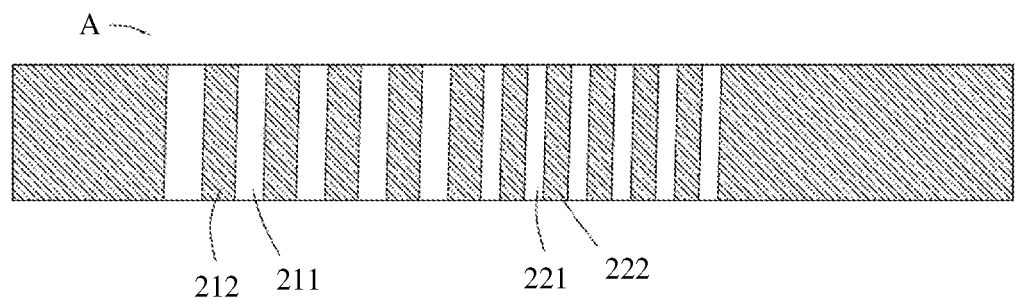

As shown in FIG. 5 and FIG. 6, in a second embodiment of the grating, the first grating 21 and the second grating 22 are arranged, on a plane parallel to the surface of the substrate 10, oblique relative to the optical signal output direction of the semiconductor optical amplification section 20. Specifically, the shading line 212 of the first grating 21 and the shading line 222 of the second grating 22 are bar-shaped, a length extending direction of the shading line is oblique relative to the waveguide direction, and the two side surfaces 2121 of the first grating 21 and the two side surfaces 2212 of the second grating 22 are perpendicular to a plane on which the active layer 25 is located. Certainly, the second grating may be not oblique.

Further, when the first grating 21 and the second grating 22 are oblique, angles of inclination thereof are 2 degrees to 10 degrees, to ensure that reflected light of the grating cannot be coupled into a waveguide of the semiconductor optical amplification section 20, so that waves of the specific wavelength pass and light of another wavelength is filtered out.

Further, a value of a spacing between the first grating 21 and the second grating 22 is an integer multiple of a length of the first grating 21 and an integer multiple of a length of the second grating 22, to mitigate phase impact and achieve a flat reflection spectrum.

In this embodiment, in order to mitigate impact of ASE noise caused by amplification from an amplifier, cascaded slanted gratings are used as a filter structure to achieve performance of a band-pass filter. Due to use of slanted gratings, reflection from the gratings cannot meet a resonance condition in a cavity, and a function of a gain clamping amplifier cannot be implemented. A filtering width of a bandpass filter can be increased by controlling periods of the first grating 21 and the second grating 22, and a band gap of a bandpass filter and contrast of filtering can be increased by improving a grating coupling factor.

As shown in FIG. 4, further, the photodetector chip includes a first electrode layer 27, a second electrode layer 37, a third electrode layer 28, and an electrical isolation groove 29 that is in the direction perpendicular to the surface 11 of the substrate 10. The first electrode layer 27 is located on the top of the semiconductor optical amplification section 20, and the second electrode layer 37 is located on the top of the photodetection section 30. Specifically, the first electrode layer 27 is located on one side, away from the substrate 10, of the waveguide of the semiconductor optical amplification section 20, and the second electrode layer 37 is located another side, away from the substrate 10, of a waveguide of the photodetection section 30. Actually, the first electrode layer 27 and the second electrode layer 37 are formed in a same step. The third electrode layer 28 is located on an outer surface 12 of the substrate 10, and the electrical isolation groove 29 is located between the first electrode layer 27 and the second electrode layer 37 to isolate the first electrode layer 27 from the second electrode layer 37. Specifically, there is no metal electrode on a surface of the electrical isolation groove 29, and the electrical isolation layer 29 is formed through recessing by a specific depth toward the direction of the substrate 10. The first electrode layer is an electrode of the semiconductor optical amplification section 20, and the second electrode layer 37 is an electrode of the photodetection section 30. Specifically, the first electrode layer 27, the second electrode layer 37, and the third electrode layer 28 can be formed through electron beam evaporation or thermal evaporation and photoetching.

Further, in this embodiment, in the optical transmission direction, a length of the semiconductor optical amplification section 20 is 50 microns to 800 microns, a length of the isolation groove 29 is 20 microns, and a length of the photodetection section 30 is 5 microns to 100 microns.

In this embodiment, in the direction perpendicular to the surface 11 of the substrate 10, located in an area of the semiconductor optical amplification section 20, the first confinement layer 251, the active layer 25, the second confinement layer 252, the spacing layer 261, and the waveguide of the semiconductor optical amplification section 20 are sequentially stacked on the surface 11 of the substrate 10. Located in an area of the photodetection section 30, the third confinement layer 351, the active layer 35, the fourth confinement layer 352, and the waveguide of the photodetection section 30 are sequentially stacked on the surface 11 of the substrate 10, and the waveguide covers a position between the semiconductor optical amplification section 20 and the photodetection section 30. The active layer 25, the first confinement layer 251, and the second confinement layer 252 of the semiconductor optical amplification section have a same length in the optical transmission direction, and one end thereof facing the photodetection section 30 form a coupling end. The active layer 35, the third confinement layer 351, and the fourth confinement layer 352 of the photodetection section 30 have a same length in the optical transmission direction, and one end thereof facing the semiconductor optical amplification section 20 form a coupling end for coupling to the coupling end of the semiconductor optical amplification section 20.

In this embodiment, for the semiconductor optical amplification section 20, the first confinement layer 251 and the second confinement layer 252 are configured to confine charge carriers and photons in the direction perpendicular to the surface 11 of the substrate 10. In order to reduce loss, in the first confinement layer 251 and the second confinement layer 252, a quaternary material such as non-intentionally doped gradient-index (GRIN) InGaAlAs is made into GRIN-SCH, and a thickness is 10 nanometers to 400 nanometers. The active layer 25 of the semiconductor optical amplification section 20 is configured to convert electrical energy into photons, and comprises a quaternary material such as non-intentionally doped InGaAlAs, and a thickness of the active layer 25 is 15 nanometers to 300 nanometers. Further, the active layer 25 of the semiconductor optical amplification section 20 may be a bulk material, a quantum well, a quantum wire, or a quantum dot. In other embodiments, the active layer 25 of the semiconductor optical amplification section 20 is a quantum well or quantum dot. For an active layer in a form of a quantum well, strain of the quantum well can be designed to make the semiconductor optical amplification section 20 become a TE polarization, TM polarization, or polarization-insensitive optical amplifier.

The first electrode layer 27 includes a metal electrode layer 271 and a contact layer 272. To facilitate formation of ohmic contact with metal, the contact layer 272 usually has heavily-doped $In_{0.53}Ga_{0.47}As$, with a doping concentration greater than $1E19$ $cm^{-3}$ and a thickness of 50 nanometers to 300 nanometers. The metal electrode layer 271 is stacked on the waveguide cover layer 26, and the contact layer 272 is stacked on the metal electrode layer 271. A material of the metal electrode layer 271 is an alloy of titanium, platinum, and gold, with a total thickness of 500 nanometers to 2 micrometers.

In this embodiment, for the photodetection section 30, the third confinement layer 351 and the fourth confinement layer 352 are configured to confine photons in a vertical direction. In order to reduce loss, a quaternary material such as non-intentionally doped gradient-index (GRIN) InGaAlAs is made into GRIN-SCH, and a thickness is 20 nanometers to 500 nanometers. The active layer 35 of the photodetection section 30 is configured to absorb a signal transmitted by the semiconductor optical amplification section 20, and may be a bulk material, a quantum well, a quantum wire, or a quantum dot. In this embodiment, the active layer 35 of the photodetection section 30 is a bulk material, a band gap of the active layer 35 determines a workable wavelength range, and the active layer 35 is usually non-intentionally doped InGaAs, with a thickness of 10 nm to 300 nm. A material of the third electrode layer 28 is a gold-germanium-nickel alloy or gold, with a thickness of 200 to 500 nanometers. In this embodiment, the active layer 35 of the photodetection section 30 and the active layer 25 of the semiconductor optical amplification section 20 are made of a same material. The third confinement layer 351 and the fourth confinement layer 352 are made of a same material as the first confinement layer 251 and the second confinement layer 252. In other embodiments, the active layer 35 and the active layer 25 may use different materials, and the third confinement layer 351 and the fourth confinement layer 352 may use a different material from the first confinement layer 251 and the second confinement layer 252.

The second electrode layer 37 includes a metal electrode layer 371 and a contact layer 372. To facilitate formation of ohmic contact with metal, the second electrode layer 37 usually has heavily-doped $In_{0.53}Ga_{0.47}As$, with a doping concentration greater than $1E19$ $cm^{-3}$ and a thickness of 50 nanometers to 300 nanometers. The metal electrode layer 371 is stacked on the waveguide cover layer 26, and the contact layer 372 is stacked on the metal electrode layer. A material of the metal electrode layer 371 is an alloy of titanium, platinum, and gold, with a thickness of 500 nanometers to 2 micrometers. Actually, the first electrode layer 27 and the second electrode layer 37 are a same electrode layer, except that they are divided by the electrical isolation groove 29. In addition, the first electrode layer 27, the second electrode layer 37, and the waveguide cover layer 26 constitute a waveguide of the photodetector chip.

The electrical isolation groove 29 achieves electrical isolation between the first electrode layer 27 and the second electrode layer 37 by recessing the metal electrode layer and the contact layer and recessing the waveguide cover layer 26 by a specific depth, and an isolation resistance is greater than 1000 ohms.

In an implementation of this embodiment, the semiconductor optical amplification section 20 includes a first coupling end, the photodetection section 30 includes a second coupling end, and the first coupling end and the second coupling end are directly connected, so that the optical signal amplified by the semiconductor optical amplification section 20 is directly coupled into the photodetection section 30, to ensure a coupling effect. The active layer 25, the waveguide cover layer 26, and the confinement layer 251 of the semiconductor optical amplification section 20 face a same end to commonly form the first coupling end, but a layer coupled is the active layer 25 of the semiconductor optical amplification section 20. Specifically, light enters the waveguide of the semiconductor optical amplification section 20 from an end surface of the semiconductor optical amplification section, and then amplified light is directly couples into the waveguide of the photodetection section 30. The semiconductor optical amplification section 20 and the photodetection section 30 are horizontally and monolithically integrated in a butt-joint or selective area growth manner to ensure that the optical signal amplified by the semiconductor optical amplification section is directly coupled into the photodetection section, so as to improve coupling efficiency.

Further, a waveguide width of the semiconductor optical amplification section 20 gradually decreases from a coupling end surface on the light input side of the semiconductor optical amplification section 20 to a direction of the photodetection section 30, and a waveguide width of the photodetection section 30 gradually increases in a direction toward the semiconductor optical amplification section 20, to ensure efficiency of light coupling between the waveguide of the semiconductor optical amplification section 20 and the waveguide of the photodetection section 30. Generally, a thickness of the active layer 35 of the photodetection section 30 is greater than a thickness of the active layer 25 of the semiconductor optical amplification section 20. For accurate coupling and loss prevention, a size difference between waveguide ends at which the coupling occurs is reduced.

Figure 7:
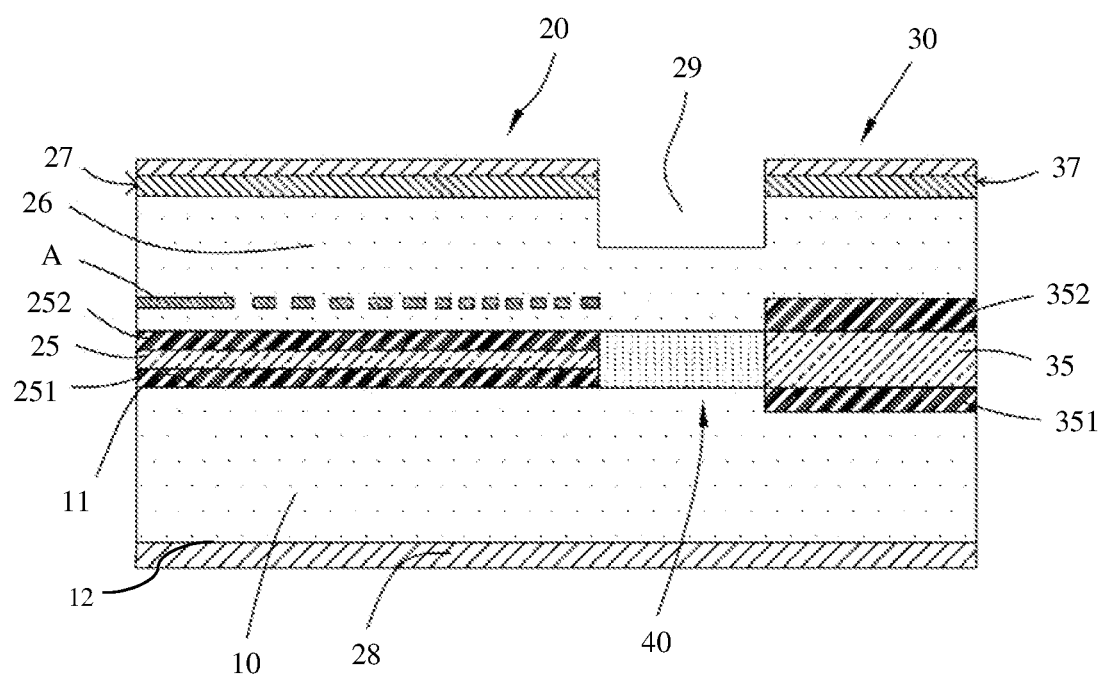
FIG. 7 is a schematic cross-sectional view of a second embodiment of a photodetector chip according to this application, which differs from the first embodiment of FIG. 1 in a manner of coupling between a semiconductor optical amplification section and a photodetection section.

As shown in FIG. 7, in another implementation of this embodiment, the photodetector chip includes a passive waveguide layer 40, and the passive waveguide layer 40 is formed on the substrate 10 between the semiconductor optical amplification section 20 and the photodetection section 30. The optical signal amplified by the semiconductor optical amplification section 20 is coupled into the photodetection section 30 through the passive waveguide layer 40. Specifically, the passive waveguide layer 40 is arranged between the semiconductor optical amplification section 20 and the photodetection section 30, and two opposite ends of the passive waveguide layer 40 respectively interconnect with the semiconductor optical amplification section 20 and the photodetection section 30. A waveguide size of the passive waveguide layer 40 coupled to the semiconductor optical amplification section 20 matches a waveguide size of the semiconductor optical amplification section, and a cross-sectional size of a waveguide coupled to the photodetection section 30 matches a waveguide cross-sectional size of the photodetection section 30, to respectively reduce mode mismatch between the semiconductor optical amplification section and the passive waveguide and mode mismatch between the passive waveguide and the photodetection section, so as to implement high efficiency of coupling between the semiconductor optical amplification section 20 and the photodetection section 30.

Further, a band gap wavelength of the passive waveguide 40 is less than a band gap wavelength of the active layer 35 of the semiconductor optical amplification section 30, and a difference is at least 150 nm, to ensure that optical transmission loss caused by the passive waveguide is low enough.

Figure 8:
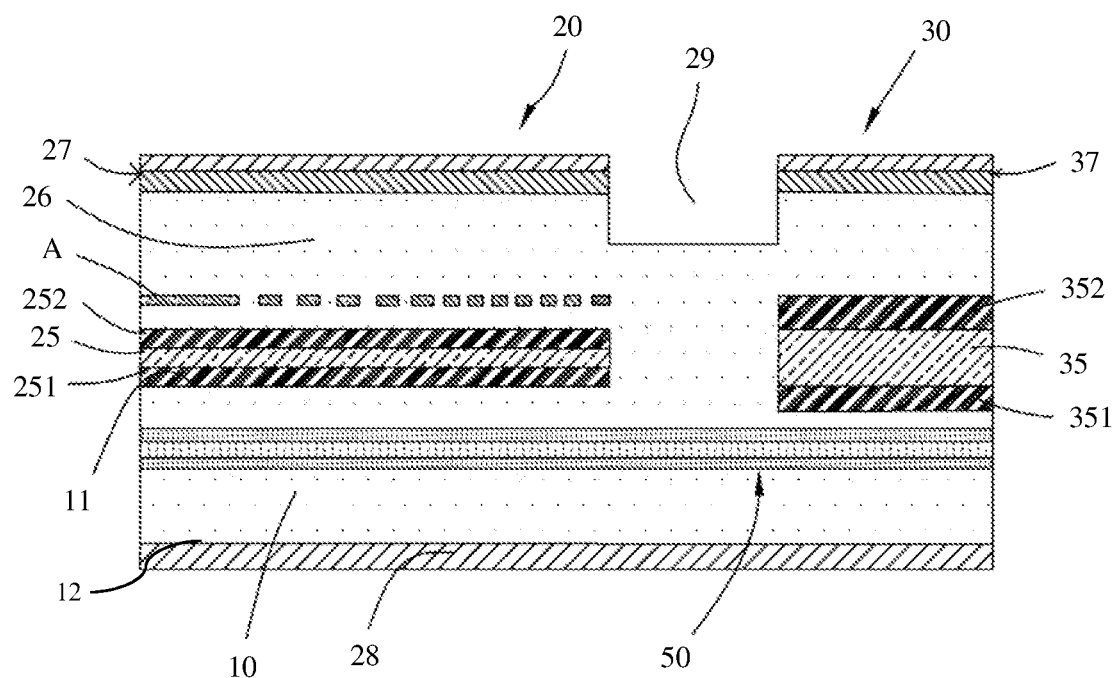
FIG. 8 is a schematic cross-sectional view of a third embodiment of a photodetector chip according to this application, which differs from the first embodiment of FIG. 1 in a manner of coupling between a semiconductor optical amplification section and a photodetection section.

As shown in FIG. 8, in another implementation of this embodiment, the photodetector chip includes a diluted waveguide layer 50 that is in the direction perpendicular to the surface 11 of the substrate 10; the diluted waveguide layer 50 is located between the active layer 25 of the semiconductor optical amplification section 20 and the active layer 35 of the photodetection section 30 and the substrate 10; and the diluted waveguide layer 50 is configured to couple, into the photodetection section 30 through the diluted waveguide layer 50, the optical signal amplified by the semiconductor optical amplification section 20. The diluted waveguide layer 50 includes two or more materials with alternating refractive indexes. Specifically, when the photodetector chip includes the passive waveguide layer 40 or the diluted waveguide layer 50, the passive waveguide layer 40 or the diluted waveguide layer 50 is formed on the substrate. Further, along the optical transmission direction, the waveguide width of the semiconductor optical amplification section 20 gradually decreases, and the waveguide width of the photodetection section 30 gradually increases, to implement high efficiency of coupling between the semiconductor optical amplification section 20 and the photodetection section 30.

An embodiment of this application provides an optical receiving component, including a receiving base, and an optical lens, a tube cap, a transimpedance amplifier, an amplitude-limiting amplifier, the photodetector chip, and the like that are arranged on the receiving base. The photodetector chip is packaged on the receiving base and configured to receive an optical signal and convert the optical signal into an electrical signal.

An embodiment of this application provides an optical transceiver component, including a base, and an optical transmitter, an optical lens, a tube cap, a transimpedance amplifier, an amplitude-limiting amplifier, and the optical receiving component that are arranged on the base. The optical transmitter, optical lens, tube cap, transimpedance amplifier, and amplitude-limiting amplifier, and the optical receiving component that are arranged on the base cooperate with each other to implement conversion of an optical signal into an electrical signal, and transmission.

An embodiment of this application provides an optical module, including a circuit board, and the optical transceiver arranged on the circuit board.

An embodiment of this application provides a communications device, including a mainboard and the optical module inserted into the main board. The communications device is an optical line terminal (OLT) in a PON system or an optical network unit (ONU) in a PON system. Alternatively, the communications device may be another device different from the OLT and the ONU.

The foregoing descriptions are exemplary implementations of embodiments of the present invention. It should be noted that a person of ordinary skill in the art may make certain improvements and polishing without departing from the principle of the embodiments of the present invention and the improvements and polishing shall fall within the protection scope of the present invention.

What is claimed is:

1. A photodetector chip, comprising a substrate, a semiconductor optical amplification section, and a photodetection section, wherein the substrate comprises a surface;
the photodetection section and the semiconductor optical amplification section are arranged on the surface of the substrate, and the photodetection section is located in an optical signal output direction of the semiconductor optical amplification section;
the semiconductor optical amplification section amplifies and filters an input optical signal to output an amplified and filtered optical signal to the photodetection section;
the photodetection section is configured to convert the amplified and filtered optical signal into an electrical signal;
the semiconductor optical amplification section comprises a grating, the grating comprises a first grating and a second grating, the first grating and the second grating are sequentially cascaded along the optical signal output direction, and the first grating is a slanted grating; and
the first grating and the second grating are configured to filter an optical signal entering the semiconductor optical amplification section, so that waves of a specific frequency band pass and waves of another frequency band are shielded.

2. The photodetector chip according to claim 1, wherein a period of the first grating is different from a period of the second grating.

3. The photodetector chip according to claim 1, wherein the first grating is arranged, in a direction perpendicular to the surface of the substrate, oblique relative to the optical signal output direction.

4. The photodetector chip according to claim 1, wherein the first grating is arranged, on a plane parallel to the surface of the substrate, oblique relative to the optical signal output direction of the semiconductor optical amplification section.

5. The photodetector chip according to claim 1, wherein an inclination angle of the first grating is 2 degrees to 10 degrees.

6. The photodetector chip according to claim 1, wherein a value of a spacing between the first grating and the second grating is an integer multiple of a length of the first grating and an integer multiple of a length of the second grating.

7. The photodetector chip according to claim 1, wherein the second grating is a slanted grating or a non-slanted grating.

8. The photodetector chip according to claim 7, wherein the second grating is arranged, in a direction perpendicular to or parallel to the surface of the substrate, oblique relative to the optical signal output direction with an inclination angle of 2 degrees to 10 degrees.

9. The photodetector chip according to claim 1, wherein the first grating and the second grating are located above or below an active layer of the semiconductor optical amplification section in the direction perpendicular to the surface of the substrate; and a vertical distance between the first and second gratings and the active layer of the semiconductor optical amplification section is less than 1000 nanometers.

10. The photodetector chip according to claim 1, wherein the first grating and the second grating are 10-nanometer to 500-nanometer thick and comprise one of materials InGaAsP, Si, GeSi, or InGaN.

11. The photodetector chip according to claim 1, wherein the semiconductor optical amplification section is directly connected to the photodetection section, so that an optical signal amplified by the semiconductor optical amplification section is directly coupled into the photodetection section.

12. The photodetector chip according to claim 11, wherein a waveguide width of the semiconductor optical amplification section gradually decreases in a direction toward the photodetection section, and a waveguide width of the photodetection section gradually increases in a direction toward the semiconductor optical amplification section.

13. The photodetector chip according to claim 1, further comprising a passive waveguide layer, wherein the optical signal amplified and filtered by the semiconductor optical amplification section is coupled into a waveguide of the photodetection section through the passive waveguide layer.

14. The photodetector chip according to claim 13, wherein a width of a waveguide of the passive waveguide layer gradually increases along an optical transmission direction.

15. The photodetector chip according to claim 14, wherein a band gap wavelength of the passive waveguide is at least 150 nm less than a band gap wavelength of an active layer of the semiconductor optical amplification section.

16. The photodetector chip according to claim 1, further comprising a diluted waveguide layer that is in a direction perpendicular to the surface of the substrate, wherein the diluted waveguide layer is located below an active layer of the semiconductor optical amplification section and an active layer of the photodetection section and located above the substrate; and the diluted waveguide layer is configured to couple, into the photodetection section through the diluted waveguide layer, the optical signal amplified and filtered by the semiconductor optical amplification section.

17. The photodetector chip according to claim 1, further comprising a first electrode layer, a second electrode layer, a third electrode layer, and an electrical isolation groove that is in a direction perpendicular to the surface of the substrate, wherein the first electrode layer is located on the top of the semiconductor optical amplification section, the second electrode layer is located on the top of the photodetection section, and the third electrode is located on an outer surface that is away from the semiconductor optical amplification section and that is of the substrate; and the electrical isolation groove is located between the first electrode and the second electrode layer to isolate the first electrode from the second electrode.

18. The photodetector chip according to claim 1, wherein the semiconductor optical amplification section comprises a first confinement layer, an active layer, and a second confinement layer that are sequentially stacked; the photodetection section comprises a third confinement layer, an active layer of the photodetection section, and a fourth confinement layer; and the active layer of the semiconductor optical amplification section is aligned with and coupled to the active layer of the photodetection section.

19. An optical receiver, comprising a receiving base and the photodetector chip according to claim 1, wherein the photodetector chip is packaged on the receiving base.

20. An optical transceiver, comprising a base, an optical transmitter, and the optical receiver according to claim 19, and the optical transmitter and the optical receiver are packaged on the base.

* * * * *